United States Patent
Kim et al.

(10) Patent No.: US 11,702,299 B2
(45) Date of Patent: Jul. 18, 2023

(54) TRANSPORT ROBOT AND SUBSTRATE TREATING APPARATUS COMPRISING THE SAME

(71) Applicant: SEMES CO., LTD., Chungcheongnam-do (KR)

(72) Inventors: Sang-Oh Kim, Seoul (KR); Jun Ho Song, Gyeonggi-do (KR); Myungjin Lee, Gyeonggi-do (KR); Heejae Byun, Gyeonggi-do (KR)

(73) Assignee: Semes Co., Ltd., Chungcheongnam-do (KR)

( * ) Notice: Subject to any disclaimer, the term of this patent is extended or adjusted under 35 U.S.C. 154(b) by 385 days.

(21) Appl. No.: 16/911,779

(22) Filed: Jun. 25, 2020

(65) Prior Publication Data

US 2020/0407179 A1    Dec. 31, 2020

(30) Foreign Application Priority Data

Jun. 26, 2019    (KR) .................. 10-2019-0076321

(51) Int. Cl.
*B65G 54/02*    (2006.01)
*B65G 47/90*    (2006.01)
(Continued)

(52) U.S. Cl.
CPC ........... *B65G 54/02* (2013.01); *B65G 47/905* (2013.01); *H01L 21/67161* (2013.01); *H01L 21/67706* (2013.01)

(58) Field of Classification Search
CPC . B65G 54/02; B65G 47/905; H01L 21/67706; H01L 21/67161; H01L 21/67196; H01L 21/67724; B25J 5/02
See application file for complete search history.

(56) References Cited

U.S. PATENT DOCUMENTS 5,170,714 A * 12/1992 Katagiri ................ B29C 51/261
                                                              104/282
9,799,544 B2   10/2017 Wirth
(Continued)

FOREIGN PATENT DOCUMENTS

JP            8-119409   *  5/1996 ................ B25J 5/02
JP       2005243995 A      9/2005
(Continued)

OTHER PUBLICATIONS

Korean Notice of Allowance issued in Korean Patent Application No. 10-2019-0076321, dated Nov. 6, 2020; 2 pages.
(Continued)

*Primary Examiner* — James R Bidwell
(74) *Attorney, Agent, or Firm* — RatnerPrestia (57) ABSTRACT

Provided is a transport robot and a substrate treating apparatus including the transport robot. The substrate treating apparatus includes a transport chamber having a long shape on one side, and for providing a moving space of a substrate, a load lock chamber connected to the transport chamber to provide an exchange space between the transport chamber and a substrate before a process or a substrate after a process, a process unit connected to the transport chamber to perform a process for a substrate transferred from the transport chamber, a track provided in the transport chamber to provide a moving path of a substrate, and a transport robot capable of moving along the track in a non-contact manner, and entering or exiting the load lock chamber to perform a substrate exchange between the load lock chamber and the transport chamber.

19 Claims, 10 Drawing Sheets

(51) Int. Cl.
    *H01L 21/677*     (2006.01)
    *H01L 21/67*     (2006.01)

(56)     References Cited

U.S. PATENT DOCUMENTS

| | | | |
|---|---|---|---|
| 2005/0113976 A1* | 5/2005 | van der Meulen | ............................ H01L 21/67706 700/264 |
| 2007/0183871 A1* | 8/2007 | Hofmeister | ....... H01L 21/67727 414/332 |
| 2011/0150608 A1* | 6/2011 | Choi | ................ H01L 21/67748 414/222.01 |
| 2017/0117171 A1* | 4/2017 | Wirth | ..................... B25J 9/1045 |
| 2019/0109031 A1* | 4/2019 | Sugawara | ......... H01J 37/32642 |

FOREIGN PATENT DOCUMENTS

| | | | | |
|---|---|---|---|---|
| KR | 1020050026371 A | | 3/2005 | |
| KR | 20120137662 | * | 12/2012 | ....... H01L 21/67742 |
| KR | 10-2017-0068676 | * | 6/2017 | ....... H01L 21/67303 |
| KR | 1020180061393 A | | 6/2018 | |
| KR | 101882902 | * | 7/2018 | ....... H01L 21/68785 |
| KR | 1020180113057 A | | 10/2018 | |
| KR | 1020180113058 A | | 10/2018 | |
| KR | 101964327 B1 | | 4/2019 | |
| KR | 10-2022-0015668 | * | 2/2022 | ....... H01L 21/67051 |

OTHER PUBLICATIONS

Korean Office Action issued in Korean Patent Application No. 10-2019-0076321, dated Jun. 26, 2019, 5 pages.

* cited by examiner

TRANSPORT ROBOT AND SUBSTRATE TREATING APPARATUS COMPRISING THE SAME

CROSS-REFERENCE TO RELATED APPLICATIONS

This patent application claims the benefit of Korean Patent Application No. 10-2019-0076321, filed on Jun. 26, 2019, which is hereby incorporated by reference in its entirety into this application.

BACKGROUND

1. Field

The present invention relates to a transport robot and a substrate treating apparatus comprising the transport robot.

2. Description of the Related Art

When manufacturing a semiconductor device or a display device, various processes such as photography, etching, ashing, ion implantation, thin film deposition, and cleaning are performed. Here, the photography process includes coating, exposure, and development processes. A photoresist is applied onto the substrate (i.e., the coating process), a circuit pattern is exposed on the substrate on which the photosensitive film is formed (i.e., exposure process), and the exposed areas of the substrate are selectively developed (i.e., development process).

A track shaped platform can be configured to minimize the area of the equipment for the substrate process. A load lock chamber is configured at one end of the track, and a plurality of process units may be provided along the length direction of the track. The track may be equipped with a robot for transporting the substrate. The robot can perform substrate exchange between the load lock chamber and the process unit while moving along the track.

SUMMARY

The problem to be solved by the present invention is to provide a transport robot and a substrate treating apparatus comprising the transport robot.

The problems of the present invention are not limited to the problems mentioned above, and other problems not mentioned will be clearly understood by those skilled in the art from the following description.

One aspect of the substrate treating apparatus of the present invention for achieving the above object comprises a transport chamber having a long shape on one side, and for providing a moving space of a substrate, a load lock chamber connected to the transport chamber to provide an exchange space between the transport chamber and a substrate before a process or a substrate after a process, a process unit connected to the transport chamber to perform a process for a substrate transferred from the transport chamber, a track provided in the transport chamber to provide a moving path of a substrate, and a transport robot capable of moving along the track in a non-contact manner and entering or exiting the load lock chamber to perform a substrate exchange between the load lock chamber and the transport chamber.

The transport robot comprises a base unit for providing a supporting surface for supporting a substrate, a supporting pin protruding from the supporting surface to support a substrate, and a magnetic force unit arranged on one side of the base unit instead of the supporting surface to alternately provide permanent magnetic force of different polarities.

The track provides varying magnetic force to the magnetic force unit to move the transport robot along the track while being spaced a predetermined distance from the track.

The track extends from the transport chamber to the inside of the load lock chamber.

The substrate treating apparatus further comprises a control module for controlling a track so that the transport robot moves from a current point to a target point.

The transport robot comprises a loading robot loading a substrate and a non-loading robot not loading a substrate, and the loading robot and the non-loading robot move along the track in pairs.

The substrate treating apparatus further comprises an exchange robot for loading a substrate, for which the process is completed in the process unit, on the non-loading robot, and carrying a substrate loaded on the loading robot into the process unit.

The exchange robot has a single hand.

The exchange robot comprises a SCARA (Selective Compliance Assembly Robot Arm) arranged on a ceiling surface of the transport chamber.

The substrate treating apparatus further comprises a position exchange chamber provided between the transport chamber and the load lock chamber to provide a space for changing positions between a plurality of transport robots.

The position exchange chamber for securing a path for carrying a transport robot loading a substrate into the load lock chamber by changing a position of a transport robot not loading a substrate.

One aspect of the transport robot of the present invention for achieving the above object comprises a base unit for providing a supporting surface for supporting a substrate and having a size capable of entering or exiting a load lock chamber, a supporting pin protruding from the supporting surface to support a substrate; and a magnetic force unit arranged on one side of the base unit instead of the supporting surface to alternately provide permanent magnetic force of different polarities, and for moving the base unit.

The track provides varying magnetic force to the magnetic force unit so that the magnetic force unit moves along the track while being spaced a predetermined distance from the track.

Another aspect of the substrate treating apparatus of the present invention for achieving the above object comprises an index module for taking a substrate out of a carrier or storing a substrate in the carrier, a process module having a track providing a moving path of a substrate, and for performing process treating for a substrate, a loading module for relaying a substrate between the process module in a vacuum atmosphere and the index module in a normal pressure atmosphere by switching an atmosphere to a vacuum atmosphere or a normal pressure atmosphere, and a control module for receiving an operation state from the index module, the process module and the loading module, and scheduling an operation of the index module, the process module and the loading module with reference to the received operation state, wherein a transport robot performs a substrate exchange between the process module and the loading module while moving along the track in a non-contact manner.

The transport robot comprises a base unit for providing a supporting surface for supporting a substrate, a supporting pin protruding from the supporting surface to support a substrate, and a magnetic force unit arranged on one side of the base unit instead of the supporting surface to alternately provide permanent magnetic force of different polarities.

The track provides varying magnetic force to the magnetic force unit so that the transport robot moves along the track while being spaced a predetermined distance from the track.

The control module controls a track so that the transport robot moves from a current point to a target point.

The transport robot comprises a loading robot loading a substrate and a non-loading robot not loading a substrate, and the loading robot and the non-loading robot move along the track in pairs.

The process module comprises a transport chamber having a long shape on one side, and for providing a moving space of a substrate, a process unit connected to the transport chamber to perform a process for a substrate transferred from the transport chamber and an exchange robot for loading a substrate, for which a process is completed in the process unit, on the non-loading robot, and carrying a substrate loaded on the loading robot into the process unit.

The loading module comprises a load lock chamber connected to the transport chamber to provide an exchange space between the transport chamber and a substrate before a process or a substrate after a process, and a position exchange chamber provided between the transport chamber and the load lock chamber to provide a space for changing positions between a plurality of transport robots.

Details of other embodiments are included in the detailed description and drawings.

DETAILED DESCRIPTION

Hereinafter, preferred embodiments of the present invention will be described in detail with reference to the accompanying drawings. Advantages and features of the present invention, and methods for achieving them will be clarified with reference to embodiments described below in detail together with the accompanying drawings. However, the present invention is not limited to the embodiments disclosed below, but may be implemented in various different forms, and only the embodiments allow the publication of the present invention to be complete, and are provided to fully inform those skilled in the technical field to which the present invention pertains of the scope of the invention, and the invention is only defined by the scope of the claims. The same reference numerals refer to the same components throughout the specification.

When elements or layers are referred to as "on" or "above" of other elements or layers, it includes not only when directly above of the other elements or layers, but also other layer or other element intervened in the middle. On the other hand, when elements are referred to as "directly on" or "directly above," it indicates that no other element or layer is intervened therebetween.

The spatially relative terms "below," "beneath," "lower," "above," "upper," etc., as shown in figures, can be used to easily describe the correlation of an element or components with other elements or components. The spatially relative terms should be understood as terms including the different direction of the element in use or operation in addition to the direction shown in the drawing. For example, if the element shown in the figure is turned over, an element described as "below" or "beneath" the other element may be placed "above" the other element. Accordingly, the exemplary term "below" can include both the directions of below and above. The element can also be oriented in other directions, so that spatially relative terms can be interpreted according to the orientation.

Although the first, second, etc. are used to describe various elements, components and/or sections, these elements, components and/or sections are not limited by these terms. These terms are only used to distinguish one element, component or section from another element, component or section. Therefore, the first element, first component or first section mentioned below may be a second element, second component or second section within the technical spirit of the present invention.

The terminology used herein is for describing the embodiments and is not intended to limit the present invention. In the present specification, the singular form also includes the plural form unless otherwise specified in the phrase. As used herein, "comprises" and/or "comprising" means that the components, steps, operations and/or elements mentioned above do not exclude the presence or additions of one or more other components, steps, operations and/or elements.

Unless otherwise defined, all terms (including technical and scientific terms) used in the present specification may be used as meanings commonly understood by those skilled in the art, to which the present invention pertains. In addition, terms defined in the commonly used dictionary are not ideally or excessively interpreted unless specifically defined.

Hereinafter, exemplary embodiments of the present invention will be described in detail with reference to the accompanying drawings, and in the description with reference to the accompanying drawings, the same or corresponding components are assigned the same reference numbers regardless of reference numerals, and the description overlapped therewith will be omitted.

Figure 1:
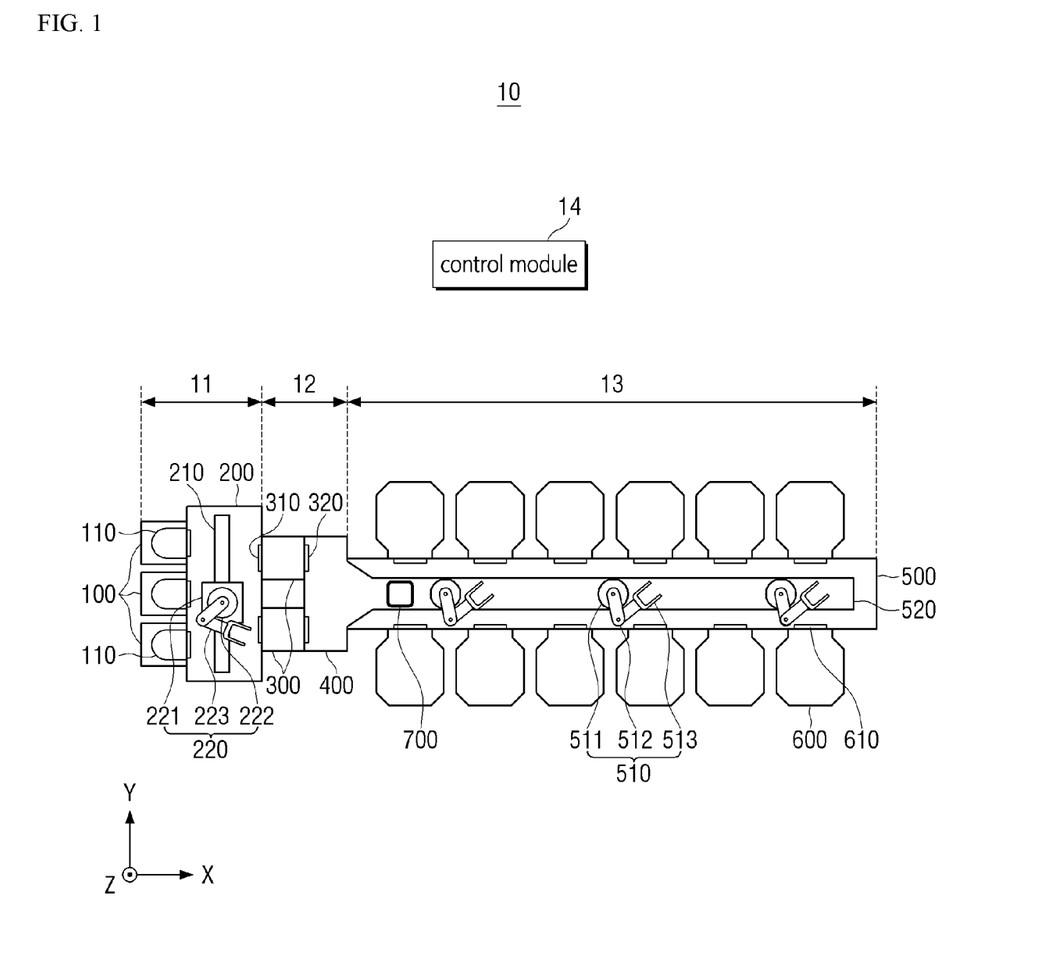
FIG. 1 is a view showing a substrate treating apparatus according to an embodiment of the present invention.

FIG. 1 is a view showing a substrate treating apparatus according to an embodiment of the present invention.

Referring to FIG. 1, the substrate treating apparatus 10 includes an index module 11, a loading module 12, a process module 13, and a control module 14.

The index module 11, the loading module 12, and the process module 13 may be arranged in a line. Hereinafter, a direction, in which the index module 11, the loading module 12, and the process module 13 are arranged, is referred to as a first direction X, and when viewed from the top, a direction perpendicular to the first direction X is referred to as a second direction Y, and the direction perpendicular to the plane including the first direction X and the second direction Y is referred as the third direction Z.

The index module 11 serves to carry the substrate into the process module 13 and to take the substrate, for which the process treating is completed, out of the process module 13. A loading module 12 may be provided between the index module 11 and the process module 13. The index module 11 may carry the substrate into the process module 13 through the loading module 12 or take the substrate out of the loading module 12.

The index module 11 may transport the substrate from the carrier 110, in which the substrate is stored, to the loading module 12, and store the substrate discharged from the loading module 12 in the carrier 110. The index module 11 may include a load port 100 and a transport frame 200.

The carrier 110 may be seated on the load port 100. A plurality of substrates may be stored in the carrier 110. A plurality of load ports 100 may be provided, and the plurality of load ports 100 may be arranged in a line in the second direction Y.

The carrier 110 may have a slot (not shown) supporting the edge of the substrate. A plurality of slots may be provided along the third direction Z. Accordingly, a plurality of substrates may be stacked inside the carrier 110 while being spaced apart from each other along the third direction Z. As the carrier 110, a front opening integrated pod (FOUP) may be used.

The transport frame 200 serves to transport the substrate between the carrier 110 and the loading module 12. The transport frame 200 may include an index rail 210 and an index robot 220.

The index rail 210 may be arranged to be parallel to the second direction Y. The index robot 220 is installed on the index rail 210 and can move in the second direction Y along the index rail 210. The index robot 220 may include an index base 221, an index body 222, and an index arm 223. The index base 221 may be installed on the index rail 210 to be movable along the index rail 210. The index body 222 is coupled to the index base 221 and can move along the index rail 210 together with the index base 221. Further, the index body 222 may move along the third direction Z with respect to the index base 221, and may rotate about an axis of rotation parallel to the third direction Z.

The index arm 223 directly supports the substrate and serves to transport the substrate. To this end, the index arm 223 may include a plurality of joints capable of angle adjustment or length adjustment between each other. Although FIG. 1 illustrates that one index arm 223 is provided on the index body 222, a plurality of index arms 223 may be provided on the index body 222. When a plurality of index arms 223 is provided, some of the plurality of index arms 223 can be used when transporting the substrate from the loading module 12 to the carrier 110, and the others can be used when transporting the substrate from the carrier 110 to the loading module 12. As the plurality of index arms 223 perform transport operations different than each other, particles generated in the substrate before the process can be prevented from being attached to the substrate after the process.

The loading module 12 serves to relay a substrate between the process module 13 in a vacuum atmosphere and the index module 11 in a normal pressure atmosphere by switching the atmosphere to a vacuum atmosphere or a normal pressure atmosphere. The inside of the process module 13 may be a vacuum atmosphere, and the index module 11 may be a normal pressure atmosphere. The loading module 12 may be provided to exchange the substrate between the process module 13 and the index module 11 while maintaining the vacuum atmosphere of the process module 13.

The loading module 12 may be arranged between the index module 11 and the process module 13. The loading module 12 may provide a space where the substrate stays before the substrate is transported between the transport frame 200 of the index module 11 and the transport chamber 500 of the process module 13. The loading module 12 may include a load lock chamber 300 and a position exchange chamber 400.

The load lock chamber 300 may be connected to the transport chamber 500 to provide an exchange space between the transport chamber 500 and the substrate before the process or the substrate after the process. The load lock chamber 300 may be provided so that the atmosphere of its internal space can be switched to a vacuum atmosphere or a normal pressure atmosphere.

One or more load lock chambers 300 may be provided in the loading module 12. FIG. 1 shows that two load lock chambers 300 are provided in the loading module 12, but only one load lock chamber 300 may be provided, and three or more load lock chambers 300 may be provided.

The load lock chamber 300 may be provided with doors 310 and 320 facing the index module 11 and the process module 13, respectively. Hereinafter, among the doors provided on both sides of the load lock chamber 300, the door facing the index module 11 is referred to as an index door 310, and the door facing the process module 13 is referred to as a transport door 320.

The load lock chamber 300 serves to temporarily receive the substrate transported from the index module 11 to the process module 13. When the substrate transferred from the index module 11 is carried into the load lock chamber 300, the index door 310 and the transport door 320 are closed, and the internal space of the load lock chamber 300 can be sealed against the index module 11 and the process module 13. After being sealed, the internal space of the load lock chamber 300 may be converted from a normal pressure atmosphere to a vacuum atmosphere. And, the substrate of the load lock chamber 300 may be taken out and transported to the transport chamber 500 while the transport door 320 is opened and the index door 310 is closed.

The load lock chamber 300 may also serve to temporarily receive the substrate transported from the process module 13 to the index module 11. When the substrate transferred from the process module 13 is carried into the load lock chamber 300, the index door 310 and the transport door 320 are closed, and the internal space of the load lock chamber 300 can be sealed against the index module 11 and the process module 13. After being sealed, the internal space of the load lock chamber 300 may be converted from a vacuum atmosphere to a normal pressure atmosphere. And, the substrate of the load lock chamber 300 may be taken out and transported to the index module 11 while the index door 310 is opened and the transport door 320 is closed.

The position exchange chamber 400 may be provided between the transport chamber 500 and the load lock chamber 300 to provide a space for changing the position between the plurality of transport robots 700. As described below, the transport robot 700 may include a loading robot and a non-loading robot, and the loading robot and the non-loading robot may move along the track in pairs. A non-loading robot among the loading robot and the non-loading robot moved from the transport chamber 500 to the load lock chamber 300 may be arranged to be close to the load lock chamber 300. In this case, the loading robot cannot be carried into the load lock chamber 300 because it is blocked by the non-loading robot. At this time, the non-loading robot may secure a path for the loading robot to be carried into the load lock chamber 300 by changing the position in the position exchange chamber 400. Thus, the loading robot can be carried into the load lock chamber 300.

The process module 13 may perform process treating for the substrate. The process module 13 may include a transport chamber 500 and a process unit 600. A plurality of process units 600 may be provided.

The transport chamber 500 may provide a space for relaying the substrate between the load lock chamber 300 and the process unit 600. The transport chamber 500 has a long shape on one side and may provide a moving space of the substrate. The process unit 600 can be arranged adjacent to the transport chamber 500. Specifically, a plurality of process units 600 may be arranged along the long side of the transport chamber 500. The process unit 600 is connected to the transport chamber 500 to perform a process for the substrate transferred from the transport chamber 500.

FIG. 1 shows that a plurality of process units 600 are arranged along each of both long sides of the transport chamber 500, but a plurality of process units 600 may be arranged along only one long side of the transport chamber 500.

A process door 610 may be provided for each process unit 600. The substrate is carried in or taken out between the transport chamber 500 and the process unit 600 in the state where the process door 610 is opened, and the process treating operation may be performed by the process unit 600 in the state where the process door 610 is closed.

The process unit 600 can perform specific operations for the substrate. For example, the process unit 600 may perform an etching or deposition process for the substrate. The process module 13 may include a plurality of process units 600, and may perform the same or different tasks for each process unit 600.

At least one exchange robot 510 may be provided in the transport chamber 500. The exchange robot 510 serves to exchange substrates between the process unit 600 and the transport robot 700. The exchange robot 510 may take out the substrate, for which the process is completed, of the process unit 600, and load it on the transport robot 700, or carry the substrate loaded on the transport robot 700 into the process unit 600. The transport robot 700 includes a loading robot and a non-loading robot, and the exchange robot 510 may load the substrate, for which the process is completed in the process unit 600, on the non-loading robot, and carry the substrate loaded on the loading robot into the process unit 600.

The exchange robot 510 may include a body 511, an arm 512 and a hand 513. The body 511 may be fixed to the transport chamber 500. In the present invention, the exchange robot 510 may be a SCARA (selective compliance assembly robot arm) arranged on a ceiling surface (not shown) of the transport chamber 500. Accordingly, the body 511 may be fixed to the ceiling surface of the transport chamber 500.

The arm 512 serves to transport the substrate. A hand 513 for supporting the substrate may be provided at the end of the arm 512. The arm 512 may include a plurality of joints capable of angle adjustment or length adjustment between each other. The hand 513 may perform a movement parallel to a plane including the first direction X and the second direction Y, and may move along the third direction Z.

The exchange robot 510 may have a single hand 513. The substrate can be taken out of the process unit 600 with only one hand 513 and loaded on the transport robot 700, or the substrate loaded on the transport robot 700 can be carried into the process unit 600.

The transport robot 700 serves to transport the substrate between the load lock chamber 300 and the process unit 600. For example, the transport robot 700 may load the substrate taken out of the load lock chamber 300 to move to the process unit 600 or load the substrate taken out of the process unit 600 to move to the load lock chamber 300.

The transport chamber 500 may be provided with a track 520 that provides a moving path of the substrate. The transport robot 700 can move along the track 520 in a non-contact manner. Further, the transport robot 700 may enter or exit the load lock chamber 300 to perform substrate exchange between the load lock chamber 300 and the transport chamber 500. To this end, the transport robot 700 may have a size capable of passing through the transport door 320. Further, the track 520 may extend from the transport chamber 500 to the inside of the load lock chamber 300.

In the present invention, the transport robot 700 may include a loading robot that load a substrate and a non-loading robot that does not load a substrate. As a plurality of transport robots 700 may be provided in the substrate treating apparatus 10, some load a substrate and others do not load a substrate.

The loading robot and the non-loading robot can move along the track 520 in pairs. The loading robot moving from the load lock chamber 300 to the process unit 600 can load the substrate before a process, and the loading robot moving from the process unit 600 to the load lock chamber 300 can load the substrate after a process.

The control module 14 receives an operation state from the process module 13, the index module 11 and the loading module 12, and serves to schedule the operation of the process module 13, the index module 11 and the loading module 12 with reference to the received operation state.

The process module 13, the index module 11, and the loading module 12 may operate organically with each other. The substrate starting from the carrier 110 of the index module 11 is carried into the process unit 600 of the process module 13 via the load lock chamber 300 of the loading module 12, and can be process treated in the process unit 600. Then, the substrate, for which process treating is completed, is carried into another process unit 600 and other process treating is performed, or is taken out to the index module 11 via the load lock chamber 300 of the loading module 12, and can be stored in the carrier 110 of the index module 11. This process is repeatedly performed, and the process module 13, the index module 11, and the loading module 12 may perform an organic operation to perform process treating for each substrate.

The control module 14 may generate and transmit equipment control information for scheduling operations of the process module 13, the index module 11, and the loading module 12. The equipment control information may include control information for controlling the equipment. Each of the equipments provided in the process module 13, the index module 11, and the loading module 12 may operate according to the received equipment control information to perform process treating for the substrate.

Figure 2:
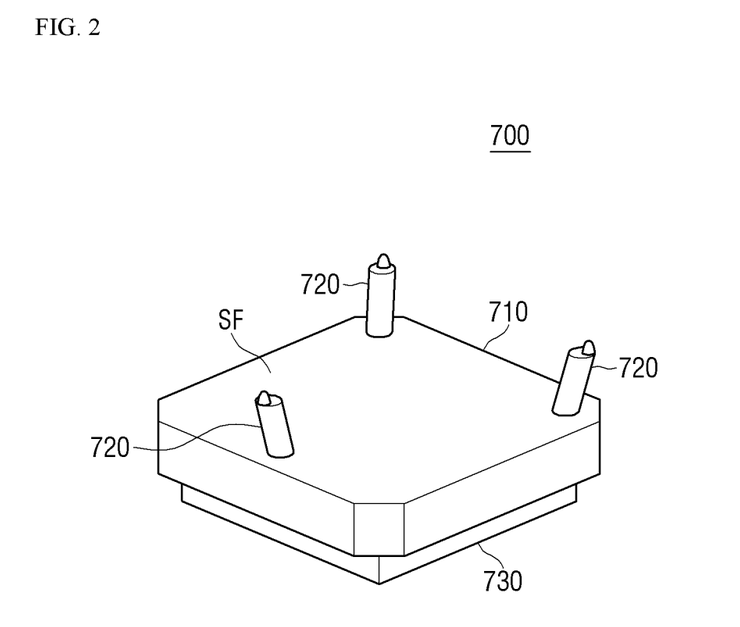
FIG. 2 is a view showing the transport robot shown in FIG. 1.
Figure 3:
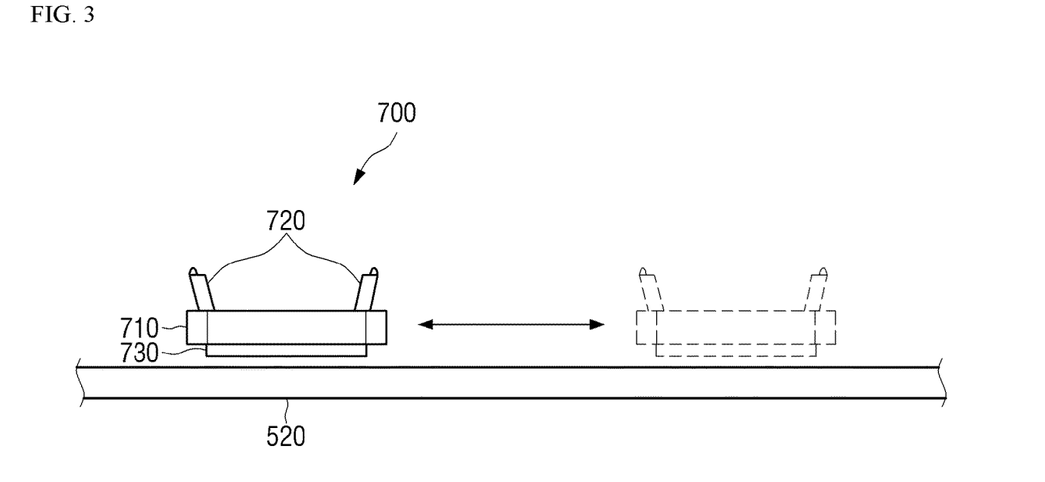
FIG. 3 is a view showing that the transport robot shown in FIG. 1 moves along a track.

FIG. 2 is a view showing the transport robot shown in FIG. 1, and FIG. 3 is a view showing that the transport robot shown in FIG. 1 moves along a track.

Referring to FIGS. 2 and 3, the transport robot 700 comprises a base unit 710, a supporting pin 720 and a magnetic force unit 730.

The base unit 710 may provide a supporting surface SF for supporting the substrate. The supporting pin 720 may be formed to protrude from the supporting surface SF to support the substrate. The substrate may be spaced by a predetermined distance from the supporting surface SF of the base unit 710 by the supporting pin 720. The hand 513 of the exchange robot 510 may be inserted into a space between the substrate and the supporting surface SF to lift the substrate.

The magnetic force unit 730 is arranged on one side of the base unit 710 instead of the supporting surface SF to alternately provide permanent magnetic force of different polarities. To this end, permanent magnets of different polarities may be provided in the magnetic force unit 730 alternatively with each other.

Referring to FIG. 3, the transport robot 700 may move along the track 520. As described above, the track 520 may extend from the transport chamber 500 to the inside of the load lock chamber 300.

The track 520 can provide varying magnetic force. For example, the track 520 may include an electromagnet. The track 520 may provide the varying magnetic force to the magnetic force unit 730 so that the transport robot 700 moves along the track 520 while being spaced a predetermined distance from the track 520.

Since the varying magnetic force of the track 520 acts on the permanent magnetic force of the magnetic force unit 730, the transport robot 700 can move while being spaced a predetermined distance from the track 520. Since the transport robot 700 moves while being spaced a predetermined distance from the track 520, friction between the transport robot 700 and the track 520 is prevented, and generation of particles due to friction can be prevented. The movement of the transport robot 700 by the track 520 is similar to the principle of a linear motor, and detailed description thereof will be omitted because it is outside the scope of the present invention.

The change in magnetic force of the track 520 may be determined by the control module 14. The control module 14 may control the track 520 so that the transport robot 700 moves from the current point to the target point. Under the control of the control module 14, the track 520 changes the magnetic force, and the transport robot 700 can move on the track 520 by the changed magnetic force.

Hereinafter, the transport process of the substrate by the transport robot 700 will be described with reference to FIGS. 4 to 10.

Figure 4:
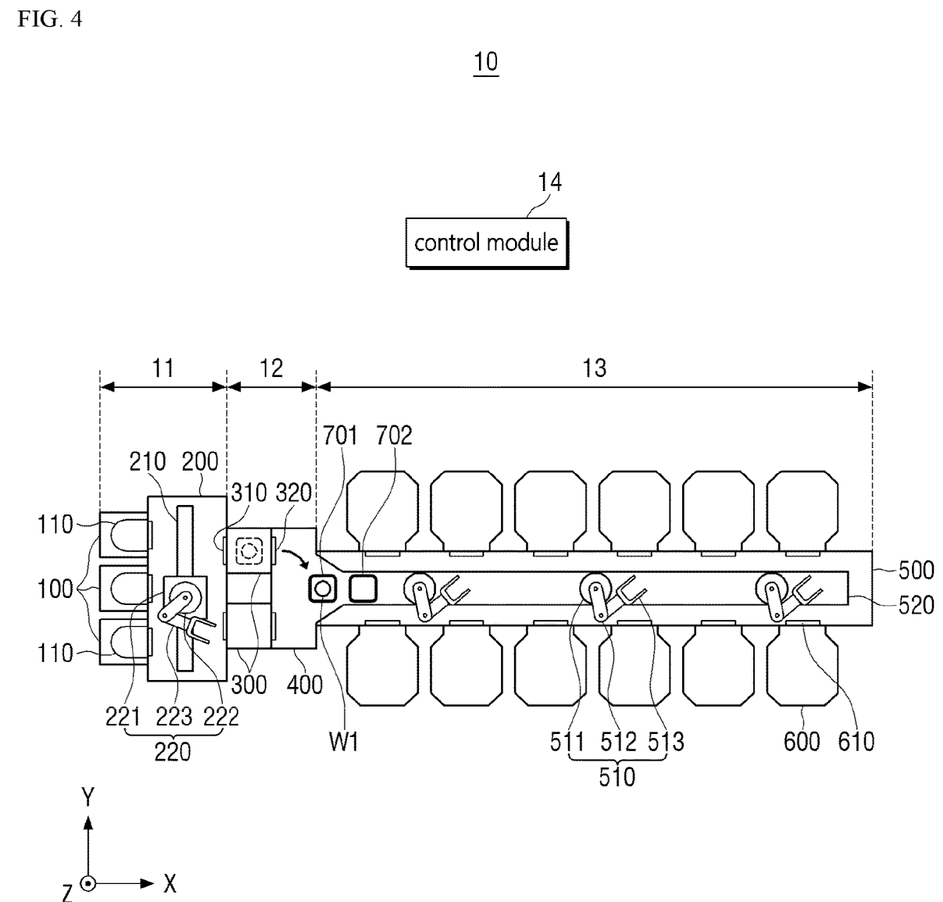
FIG. 4 is a view showing that the transport robot is taken out of the load lock chamber shown in FIG. 1.
Figure 5:
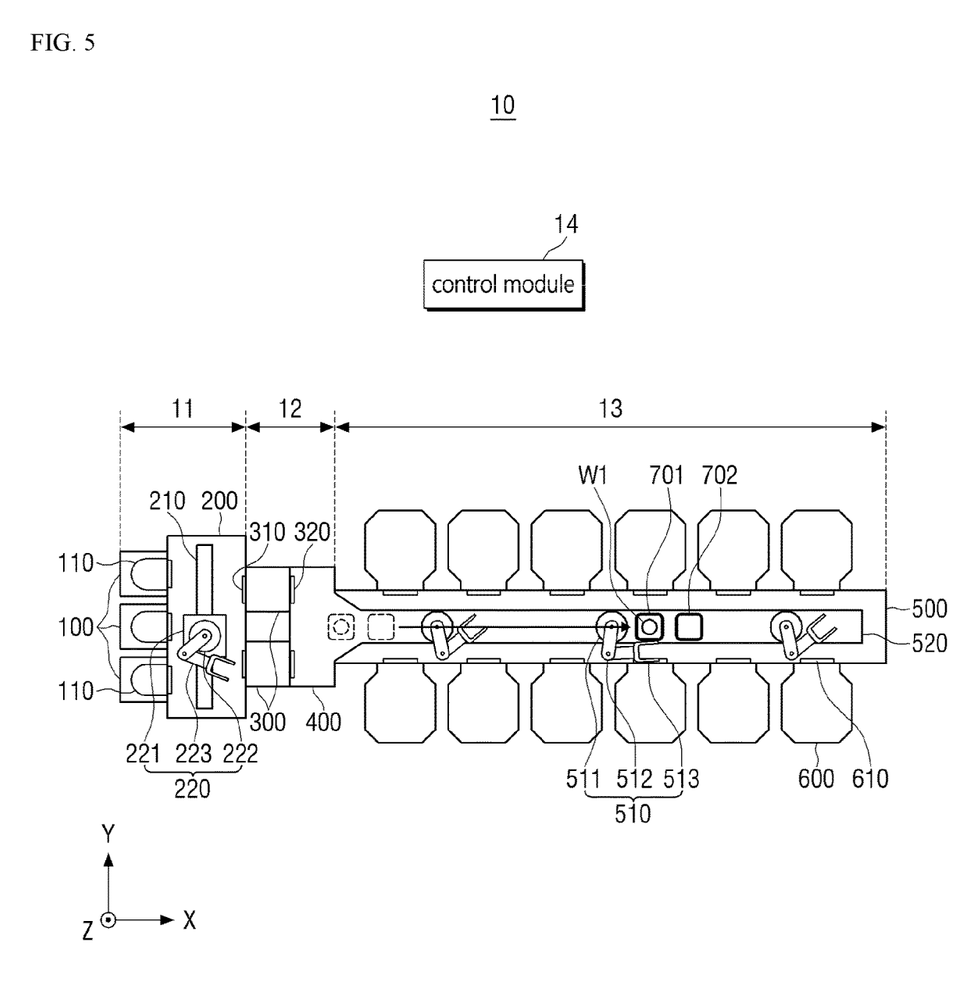
FIG. 5 is a view showing that the loading robot and the non-loading robot shown in FIG. 4 move along the track.
Figure 6:
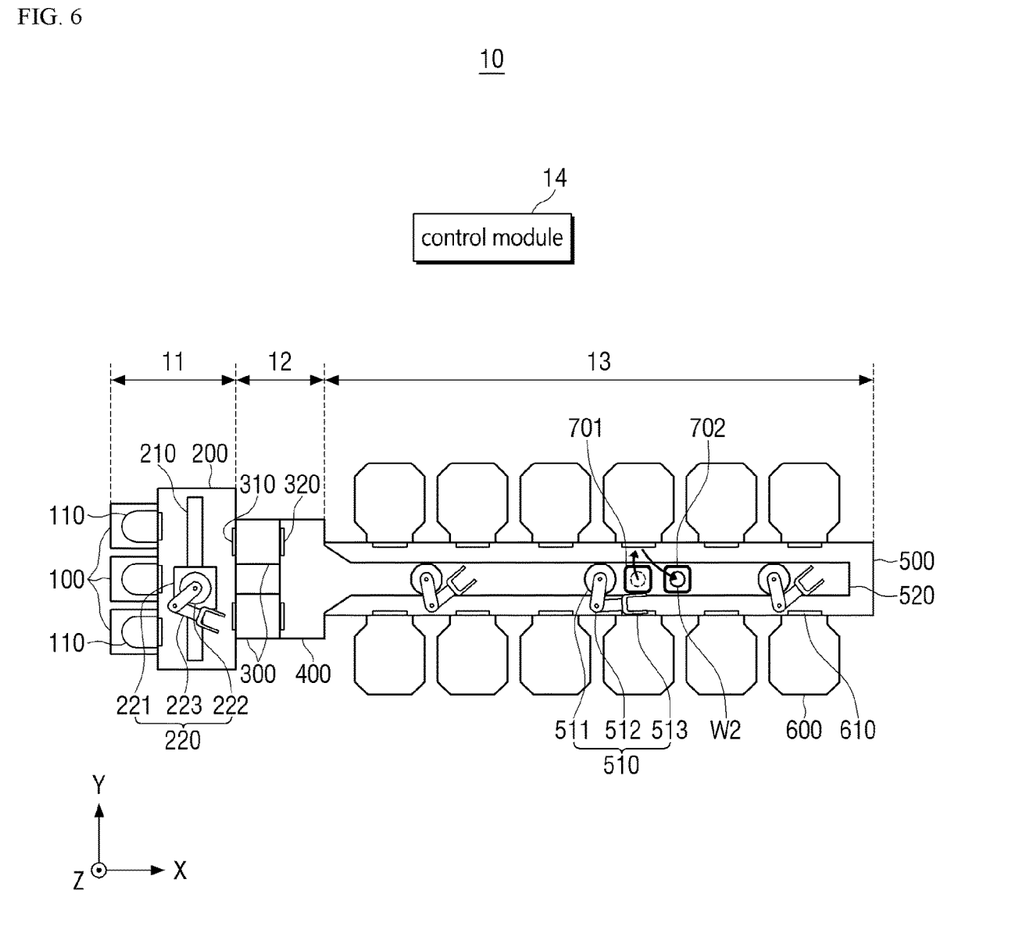
FIG. 6 is a view showing that the exchange robot exchanges the substrate with respect to the loading robot and the non-loading robot shown in FIG. 5.
Figure 7:
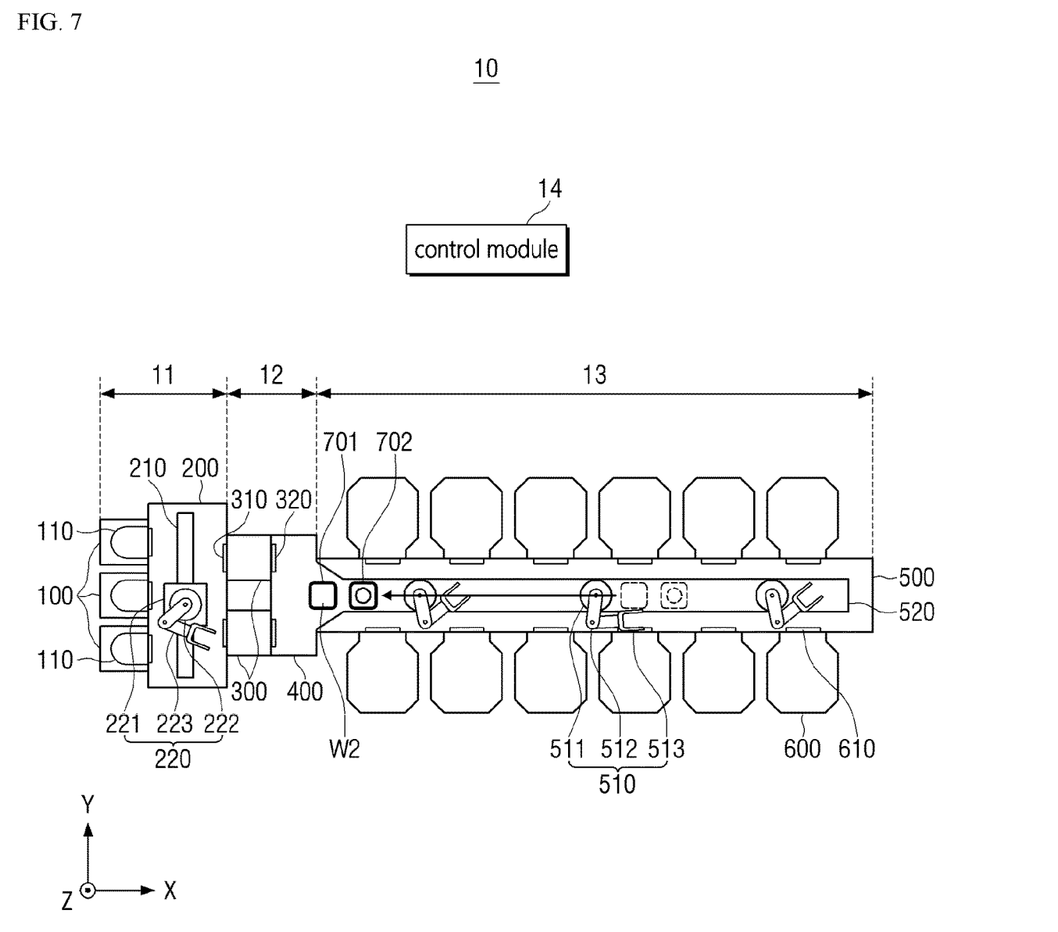
FIG. 7 is a view showing that the loading robot and the non-loading robot, in which the substrate is exchanged in FIG. 6, move along the track.
Figure 8:
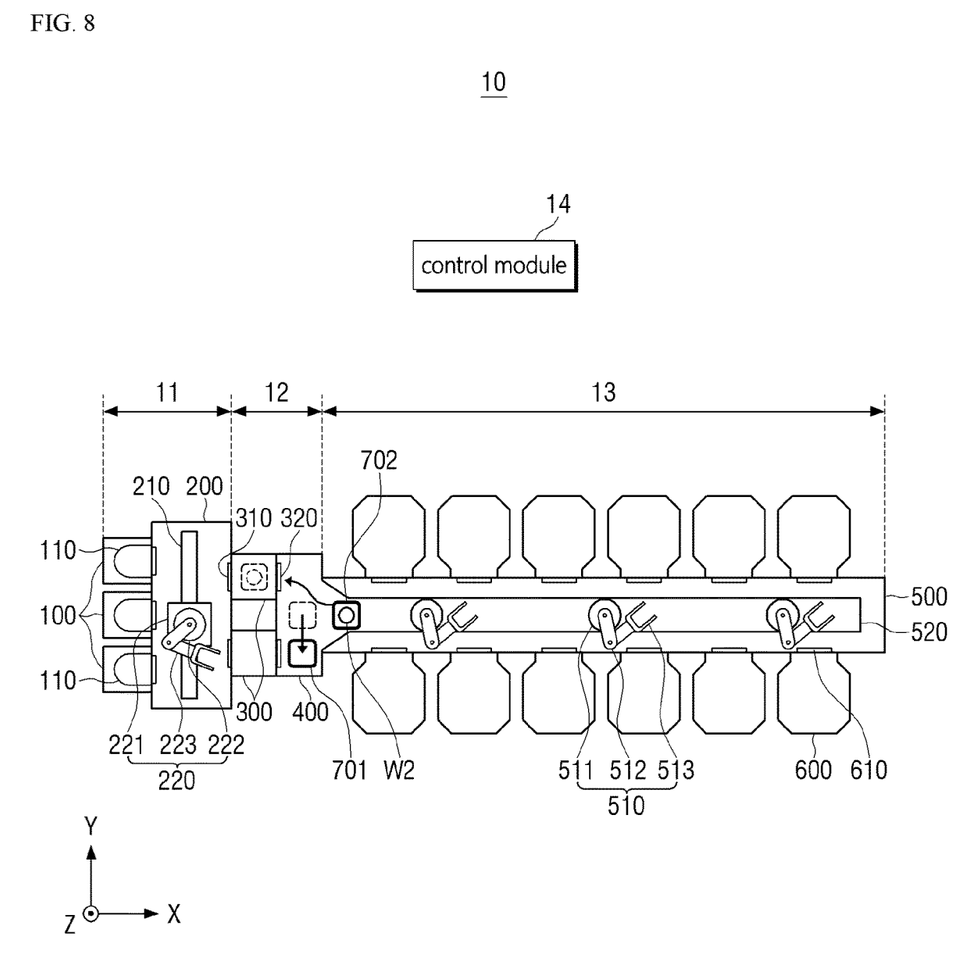
FIG. 8 is a view showing that the loading robot shown in FIG. 7 is carried into the load lock chamber.
Figure 9:
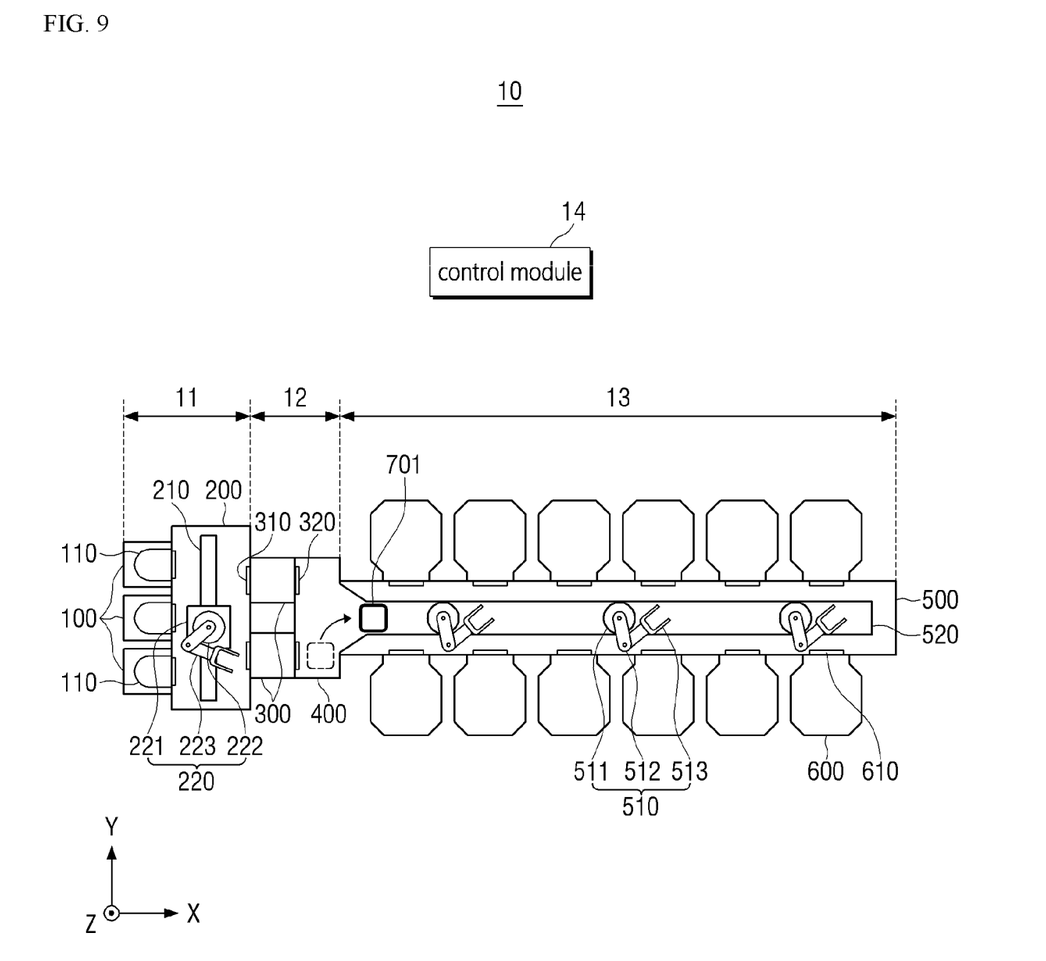
FIG. 9 is a view showing that the position of the non-loading robot shown in FIG. 8 is changed.
Figure 10:
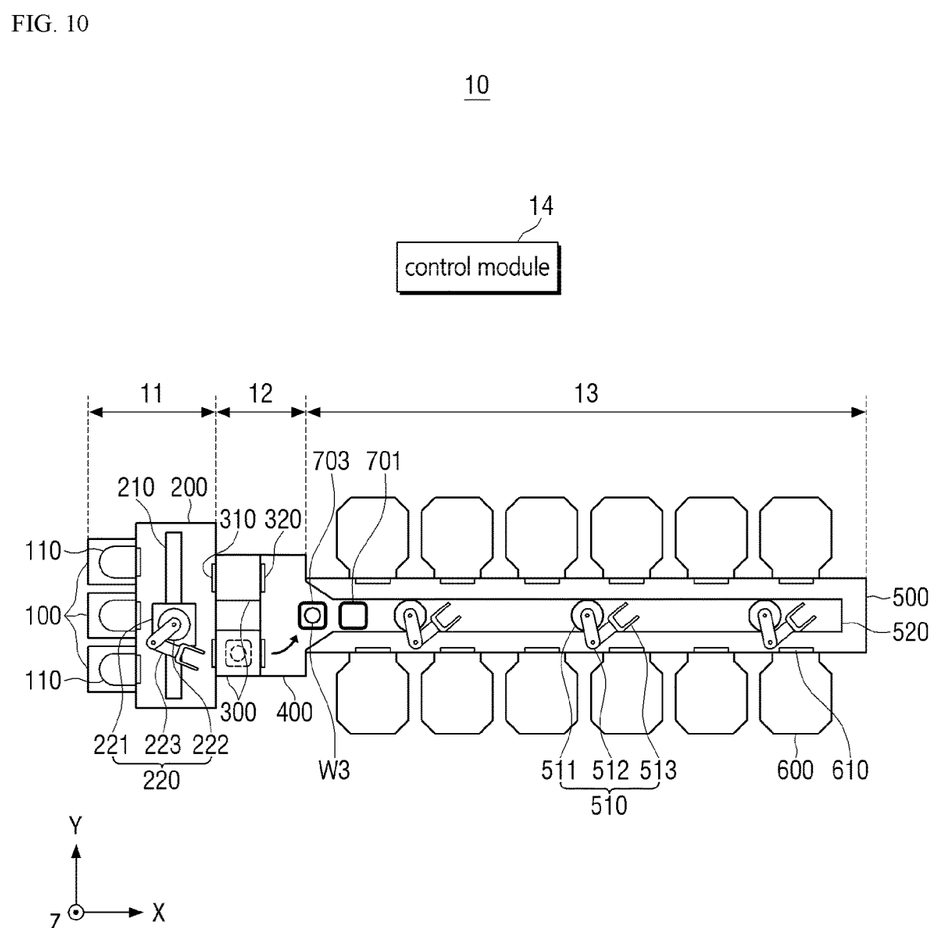
FIG. 10 is a view showing that the loading robot is taken out of the load lock chamber shown in FIG. 9.

FIG. 4 is a view showing that the transport robot is taken out of the load lock chamber shown in FIG. 1, and FIG. 5 is a view showing that the loading robot and the non-loading robot shown in FIG. 4 move along the track, and FIG. 6 is a view showing that the exchange robot exchanges the substrate for the loading robot and the non-loading robot shown in FIG. 5, and FIG. 7 is a view showing that the loading robot and the non-loading robot, in which the substrate is exchanged in FIG. 6, move along the track, and FIG. 8 is a view showing that the loading robot shown in FIG. 7 is carried into the load lock chamber, and FIG. 9 is a view showing that the position of the non-loading robot shown in FIG. 8 is changed, and FIG. 10 is a view showing that the loading robot is taken out of the load lock chamber shown in FIG. 9.

Referring to FIG. 4, the transport robot 701 may be taken out of the load lock chamber 300.

The transport robot 701 may load a substrate W1. The index robot 220 may load the substrate W1 on the transport robot 701 previously carried into the load lock chamber 300.

The transport robot 701 may move toward the transport chamber 500 via the position exchange chamber 400. At this time, the transport robot 702 without loading the substrate may wait. Hereinafter, the transport robot taken out of the load lock chamber 300 by loading the substrate W1 is referred to as a first transport robot 701, and a transport robot waiting without loading a substrate is referred to as a second transport robot 702. The first transport robot 701 may be a loading robot, and the second transport robot 702 may be a non-loading robot.

Referring to FIG. 5, the first transport robot 701 and the second transport robot 702 may move along the track 520 in pairs.

That is, the first transport robot 701 and the second transport robot 702 are able to move along the track 520 at the same or similar speed in a state close to each other. The first transport robot 701 and the second transport robot 702 may move to a position adjacent to the target process chamber 600.

Referring to FIG. 6, the exchange robot 510 adjacent to the target process chamber 600 may perform substrate exchange.

First, the exchange robot 510 may take out the substrate W2, for which process is completed, of the target process chamber 600 and load it on the second transport robot 702 which is a non-loading robot. Then, the exchange robot 510 may carry the substrate W1 loaded on the first transport robot 701, which is the loading robot, into the target process chamber 600. With only one hand 513, the exchange robot 510 may perform substrate exchange between the first transport robot 701, the second transport robot 702, and the target process chamber 600.

Accordingly, the first transport robot 701 becomes a non-loading robot, and the second transport robot 702 becomes a loading robot.

Referring to FIG. 7, the first transport robot 701 and the second transport robot 702 may move along the track 520.

The first transport robot 701 and the second transport robot 702 may move along the track 520 at the same or similar speed in a state close to each other. The first transport robot 701 and the second transport robot 702 may move to the position adjacent to the load lock chamber 300.

Referring to FIG. 8, the second transport robot 702, which is a loading robot, may be carried into the load lock chamber 300.

In order to move of the second transport robot 702, the first transport robot 701 may change the position in the position exchange chamber 400. As the first transport robot 701 changes the position, a path from the second transport robot 702 to the load lock chamber 300 is secured, and the second transport robot 702 can move to the load lock chamber 300 along the secured path.

The substrate W2 loaded on the second transport robot 702 after being carried into the load lock chamber 300 may be transported by the index robot 220 and stored in the carrier 110.

Referring to FIG. 9, the first transport robot 701, which is a non-loading robot, may change its position. That is, the first transport robot 701 may move from the position exchange chamber 400 to the transport chamber 500. Accordingly, a space, in which another transport robot is positioned, may be provided in front of the transport door 320 of the load lock chamber 300.

Referring to FIG. 10, the transport robot 703 may be taken out of the load lock chamber 300.

The transport robot 703 may load a substrate W3. Hereinafter, the transport robot taken out of the load lock chamber 300 by loading the substrate W3 is referred to as a third transport robot 703.

The third transport robot 703 may move toward the transport chamber 500 via the position exchange chamber 400. At this time, the first transport robot 701 without loading the substrate may wait.

Subsequently, the third transport robot 703 loading the substrate W3 and the first transport robot 701 not loading the substrate move along the track 520 in pairs and can repeat the processes of FIGS. 5 to 9.

Although the embodiments of the present invention have been described with reference to the above and the accompanying drawings, those of ordinary skill in the art to which the present invention pertains could understand that the present invention may be implemented in other specific forms without changing its technical spirit or essential features. Therefore, it should be understood that the embodiments described above are illustrative in all respects and not restrictive.

What is claimed is:

1. A substrate treating apparatus comprising:
   a transport chamber having a long shape on one side, and for providing a moving space of a substrate;
   a load lock chamber connected to the transport chamber to provide an exchange space between the transport chamber and a substrate before a process or a substrate after a process;
   a process unit connected to the transport chamber to perform a process for a substrate transferred from the transport chamber;
   a track provided in the transport chamber to provide a moving path of a substrate, the track extending from the transport chamber to the inside of the load lock chamber; and
   a transport robot capable of moving along the track in a non-contact manner, and entering or exiting the load lock chamber to perform a substrate exchange between the load lock chamber and the transport chamber.

2. The substrate treating apparatus of claim 1, wherein the transport robot comprises,
   a base unit for providing a supporting surface for supporting a substrate;
   a supporting pin protruding from the supporting surface to support a substrate; and
   a magnetic force unit arranged on one side of the base unit instead of the supporting surface to alternately provide permanent magnetic force of different polarities.

3. The substrate treating apparatus of claim 2, wherein the track provides varying magnetic force to the magnetic force unit to move the transport robot along the track while being spaced a predetermined distance from the track.

4. The substrate treating apparatus of claim 1, further comprising,
   a control module for controlling a track so that the transport robot moves from a current point to a target point.

5. The substrate treating apparatus of claim 1, wherein the transport robot comprises a loading robot loading a substrate and a non-loading robot not loading a substrate,
   wherein the loading robot and the non-loading robot move along the track in pairs.

6. The substrate treating apparatus of claim 5, further comprising,
   an exchange robot for loading a substrate, for which a process is completed in the process unit, on the non-loading robot, and carrying a substrate loaded on the loading robot into the process unit.

7. The substrate treating apparatus of claim 6, wherein the exchange robot has a single hand.

8. The substrate treating apparatus of claim 6, wherein the exchange robot comprises a SCARA (Selective Compliance Assembly Robot Arm) arranged on a ceiling surface of the transport chamber.

9. The substrate treating apparatus of claim 1, further comprising,
   a position exchange chamber provided between the transport chamber and the load lock chamber to provide a space for changing positions between a plurality of transport robots.

10. The substrate treating apparatus of claim 9, wherein the position exchange chamber for securing a path for carrying a transport robot loading a substrate into the load lock chamber by changing a position of a transport robot not loading a substrate.

11. A transport robot comprising:
    a base unit having a top surface and a bottom surface which is opposite the top surface, the top surface providing a supporting surface for supporting a substrate, and having a size capable of entering or exiting a load lock chamber;
    a supporting pin protruding from the top surface to support a substrate; and
    a magnetic force unit arranged on the bottom surface of the base unit to alternately provide permanent magnetic force of different polarities, and for moving the base unit.

12. The transport robot of claim 11, wherein a track provides varying magnetic force to the magnetic force unit so that the magnetic force unit moves along the track while being spaced a predetermined distance from the track.

13. A substrate treating apparatus comprising:
    an index module for taking a substrate out of a carrier or storing a substrate in the carrier;
    a process module having a track providing a moving path of a substrate, and for performing process treating for a substrate;
    a loading module for relaying a substrate between the process module in a vacuum atmosphere and the index module in a normal pressure atmosphere by switching an atmosphere to a vacuum atmosphere or a normal pressure atmosphere; and
    a control module for receiving an operation state from the index module, the process module and the loading module, and scheduling an operation of the index module, the process module and the loading module with reference to the received operation state,
    wherein a transport robot performs a substrate exchange between the process module and the loading module while moving along the track in a non-contact manner.

14. The substrate treating apparatus of claim 13, wherein the transport robot comprises,
    a base unit for providing a supporting surface for supporting a substrate;
    a supporting pin protruding from the supporting surface to support a substrate; and
    a magnetic force unit arranged on one side of the base unit instead of the supporting surface to alternately provide permanent magnetic force of different polarities.

15. The substrate treating apparatus of claim 14,
wherein the track provides varying magnetic force to the magnetic force unit so that the transport robot moves along the track while being spaced a predetermined distance from the track.

16. The substrate treating apparatus of claim 13,
wherein the control module controls a track so that the transport robot moves from a current point to a target point.

17. The substrate treating apparatus of claim 13,
wherein the transport robot comprises a loading robot loading a substrate and a non-loading robot not loading a substrate,
wherein the loading robot and the non-loading robot move along the track in pairs.

18. The substrate treating apparatus of claim 13,
wherein the process module comprises,
a transport chamber having a long shape on one side, and for providing a moving space of a substrate;
a process unit connected to the transport chamber to perform a process for a substrate transferred from the transport chamber; and
an exchange robot for loading a substrate, for which a process is completed in the process unit, on the non-loading robot, and carrying a substrate loaded on the loading robot into the process unit.

19. The substrate treating apparatus of claim 18,
wherein the loading module comprises,
a load lock chamber connected to the transport chamber to provide an exchange space between the transport chamber and a substrate before a process or a substrate after a process; and
a position exchange chamber provided between the transport chamber and the load lock chamber to provide a space for changing positions between a plurality of transport robots.

* * * * *